(12) United States Patent
Yamamoto

(10) Patent No.: US 7,731,470 B2
(45) Date of Patent: Jun. 8, 2010

(54) CLEAN STOCKER AND METHOD OF STORING ARTICLES

(75) Inventor: Makoto Yamamoto, Kyoto (JP)

(73) Assignee: Murata Kikai Kabushiki Kaisha, Kyoto-shi (JP)

(*) Notice: Subject to any disclaimer, the term of this patent is extended or adjusted under 35 U.S.C. 154(b) by 197 days.

(21) Appl. No.: 11/831,262

(22) Filed: Jul. 31, 2007

(65) Prior Publication Data

US 2008/0023417 A1 Jan. 31, 2008

(30) Foreign Application Priority Data

Jul. 31, 2006 (JP) .............................. 2006-207400

(51) Int. Cl.
*B65G 1/00* (2006.01)
(52) U.S. Cl. .............................. 414/331.05; 414/416.08; 414/940
(58) Field of Classification Search ............ 414/416.08, 414/331.02, 331.05, 940
See application file for complete search history.

(56) References Cited

U.S. PATENT DOCUMENTS

| | | | | |
|---|---|---|---|---|
| 4,986,715 A | * | 1/1991 | Asakawa | 414/331.05 |
| 6,582,174 B1 | * | 6/2003 | Hayashi | 414/217 |
| 6,663,332 B1 | * | 12/2003 | Sluijk et al. | 414/160 |
| 6,846,146 B2 | * | 1/2005 | Inui | 414/331.05 |
| 6,848,876 B2 | * | 2/2005 | Babbs et al. | 414/217.1 |
| 2001/0038783 A1 | * | 11/2001 | Nakashima et al. | 414/217 |
| 2003/0091410 A1 | * | 5/2003 | Larson et al. | 414/217 |

FOREIGN PATENT DOCUMENTS

| | | |
|---|---|---|
| JP | 62-172127 A | 7/1987 |
| JP | 2000-91401 A | 3/2000 |
| JP | 2000-091401 A | 3/2000 |
| JP | 2005-203498 A | 7/2005 |
| JP | 2005-347667 A | 12/2005 |

OTHER PUBLICATIONS

Notification of Reasons for Refusal dated May 20, 2008, issued in corresponding Japanese Patent Application No. 2006-207400 and English translation.

* cited by examiner

*Primary Examiner*—Saúl J Rodríguez
*Assistant Examiner*—Jonathan D Snelting
(74) *Attorney, Agent, or Firm*—Westerman, Hattori, Daniels & Adrian, LLP

(57) ABSTRACT

A reticle rotatable rack is provided at an upper position, and a pod rotatable rack is provided at a lower position in a clean stocker. A clean gas is supplied downwardly. In the stocker, a pod transportation device and a reticle transportation device are elevated and lowered. Load ports, a pod opener, and the pod rotatable rack are connected by the pod transportation device. The pod opener and the reticle rotatable rack are connected by the reticle transportation device.

6 Claims, 3 Drawing Sheets

CLEAN STOCKER AND METHOD OF STORING ARTICLES

TECHNICAL FIELD

The present invention relates to a clean stocker for storing articles such as reticles for semiconductor exposure cleanly, and a method of storing the articles in the clean stocker.

BACKGROUND ART

Reticles are used for exposure of semiconductors or the like. The reticles are placed in pods, and transported between a stocker and an exposure apparatus. With respect to storage of the reticles, Japanese Patent No. 3682170 discloses a technique of providing a rack for storing reticles that are not placed in pods, and a rack for storing pods on both sides of a travel route of transportation devices. However, in the technique, the reticles may be contaminated undesirably by the wind generated by the transportation devices moving along the travel route.

SUMMARY OF THE INVENTION

An object of the present invention is to store a large number of articles and containers for the articles in a compact space cleanly.

Another object of the present invention is to store a large number of articles and containers for the articles in a further compact space.

Still another object of the present invention is to make it possible to achieve efficient storage and retrieval of containers containing articles.

Still another object of the present invention is to provide a method of storage and retrieval of a large number of articles and containers for the articles which makes it possible to store the articles and the containers in a compact space cleanly.

The present invention relates to a clean stocker for storing and retrieving an article placed in a container from a storage and retrieval port. A down flow of a clean gas is provided in the clean stocker. The clean stocker comprises an opening and closing device, a storage rack for the article, a storage rack for the container, a container transportation device, and an article transportation device. The opening and closing device places the article into, and takes the article out of the container. The storage rack for the article is disposed on an upper side and the storage rack for the container is disposed on a lower side such that the storage rack for the article and the storage rack for the container are vertically overlapped with each other in a plan view. The container transportation device transports the container among the opening and closing device, the storage and retrieval port, and the storage rack for the container, and the article transportation device transports the article between the opening and closing device and the storage rack for the article.

Preferably, the storage rack for the article and the storage rack for the container are rotatable racks that are horizontally rotatable independently from each other.

In particular, it is preferable that the article transportation device and the container transportation device face each other on one side of the storage rack for the article and the storage rack for the container such that the opening and closing device is interposed between the article transportation device and the container transportation device.

Further, preferably, a fixed rack for storing the container is provided in addition to the storage rack for the container, at a position where the container transportation device can transport the container.

Further, the present invention relates to a method of retrieving and storing an article placed in a container from a retrieval and storage port, and storing the article cleanly by providing a down flow of a clean gas. The method comprises the steps of placing the article into, and taking the article out of the container which is retrieved and stored from the retrieval and storage port; disposing a storage rack for the article taken out from the container on an upper side, and a storage rack for the container on a lower side such that the storage rack for the article and the storage rack for the container are vertically overlapped with each other in a plan view, and supplying the clean gas to the storage rack for the article, and thereafter, to the storage rack for the container; providing a container transportation device for transporting the container and an article transportation device for transporting the article; and transporting the container among the opening and closing device, the retrieval and storage port, and the storage rack for the container using the container transportation device; and transporting the article between the storage rack for the article and the opening and closing device using the article transportation device.

In this specification, unless specifically noted, description about the clean stocker is applicable to the method of storing articles using the clean stocker. Further, unless specifically noted, description about the method of storing articles using the clean stocker is applicable to the clean stocker. Further, in the embodiment, although storage of reticles for semiconductor exposure and pods containing the reticles is taken as an example, the type of stored articles and the type of containers containing the articles can be adopted arbitrarily.

ADVANTAGES OF THE INVENTION

In the present invention, the storage rack for the articles is disposed on the upper side, and the storage rack for the containers is disposed on the lower side. In this state, the down flow of the clean gas is supplied. Therefore, it is possible to store the articles taken out from the containers cleanly. Since the articles are stored after they are taken out from the containers, it is possible to store a large number of articles in a compact space. The number of the stored articles and the number of stored containers need not to be the same. For example, if the number of the containers is smaller than the number of articles, and only the containers in the number required for storage and retrieval of the articles are stored, it is possible to place a large number of articles in a compact space of the rack.

In the case where the storage rack for the articles and the storage rack for the containers are rotatable racks horizontally rotatable independently from each other, it is sufficient that the container transportation device and the article transportation device can move the containers or the articles at predetermined positions of the rotatable racks. In the structure, the operating ranges of these transportation devices are reduced. As a result, it is possible to store a large number of articles or containers in a further compact space. Further, in the rotatable rack, a space is left at the center of the rack. The space can be used as an exhaust gas path of the clean gas.

If the article transportation device and the container transportation device face each other on one side of the storage rack for the article and the storage rack for the container such that the opening and closing device is interposed between the article transportation device and the container transportation device, it is possible to provide these transportation devices in a further compact space. In particular, if each of these transportation devices comprises a transportation device body and its elevation means, even in the case where the rotatable racks for the containers and the articles have upper and lower multiple stages, and the opening and closing device and these racks are provided at different height positions, it is possible to transport the containers and the articles easily.

In addition to the rotatable racks for the containers, by providing a fixed rack for storing the containers, and the container containing the article to be retrieved is stored in advance, it is possible to retrieve the articles efficiently in a short period of time. Further, if articles are stored successively, it is possible to temporarily store the articles in the fixed rack before the container is set in the opening and closing device. Thus, it is possible to carry out storage and retrieval of articles efficiently.

DETAILED DESCRIPTION OF THE INVENTION

Figure 1:
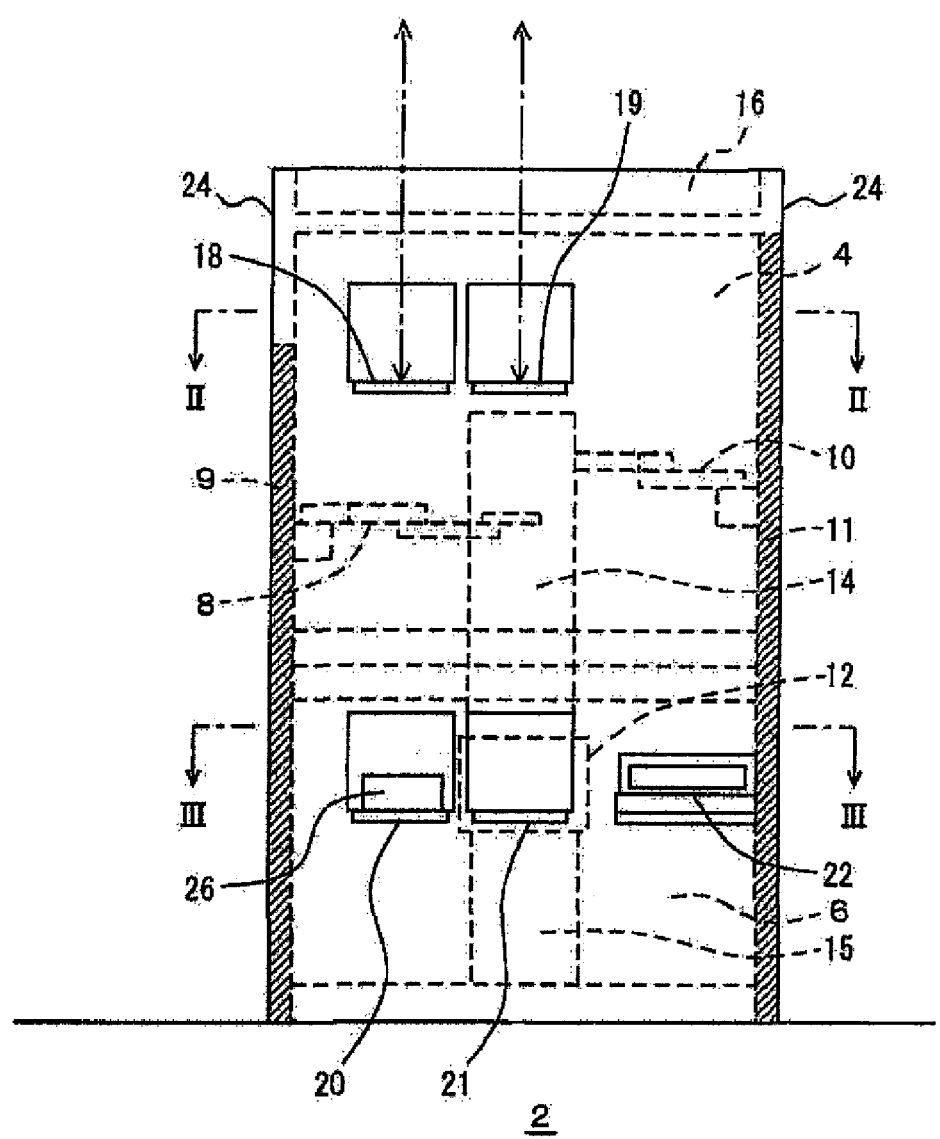
FIG. 1 is a front view showing a clean stocker according to an embodiment.

FIGS. 1 to 5 show a clean stocker 2 and a method of storing articles according to an embodiment. In the drawings, a reference numeral 2 denotes the clean stocker provided in a clean room of, e.g., a semiconductor factory or a liquid crystal factory. A reference numeral 4 denotes a reticle rotatable rack including a large number of, upper and lower multiple stages. In each stage, reticles for exposure of semiconductors or liquid crystal substrates are stored. The reticle rotatable rack 4 rotates as a whole, and the stages of the reticle rotatable rack 4 do not rotate individually. In order to store the reticles in, and retrieve the reticles from the reticle rotatable rack 4, the reticle rotatable rack 4 may be divided into a plurality of upper and lower blocks such that each block can rotate independently. A reference numeral 6 denotes a pod rotatable rack. After the reticles are taken out from pods, the empty pods are stored in the pod rotatable rack 6. The number of the stored pods is smaller than the number of the stored reticles. For example, the number of the stored pods is about 1/100 to 1/100 of the number of the stored reticles. The pod rotatable rack 6 includes upper and lower multiple stages, and rotates as a whole as the articles. Instead of the reticles, wafers or the like may be stored in the clean stocker.

In the case where the clean stocker 2 is viewed from the front side (FIG. 1), a pod transportation device 8 is provided on one of the left and right, and a reticle transportation device is provided on the other of the left and right, on the front side in the clean stocker 2. The pod transportation device 8 and the reticle transportation device 10 are provided on one side in front of the rotatable racks 4, 6, and a pod opener 12 is provided between the pod transportation device 8 and the reticle transportation device 10. Further, pod fixed racks 14, 15 are provided, e.g., above and below the pod opener 12. Alternatively, the pod fixed rack may be provided only above or below the pod opener 12. Further, the transportation devices 8, 10 are elevated or lowered along elevation guides 9, 11. For example, the pod transportation device 8 includes dual arms 8a, 8b, and a hand 8c provided at the front end of the arms 8a, 8b. The pod transportation device 8 has three joints 8d, 8e, 8f for pivotally moving the arms 8a, 8b and the hand 8c in a horizontal plane. For example, the joints 8d, 8e, 8f are operated independently for transporting a pod 26 in an arbitral direction in a range reachable by the dual arms. Likewise, the reticle transportation device 10 includes dual arms 10a, 10b pivotally movable by joints 10c, 10d, and a hand provided at the front end of the arms 10a, 10b. The structure of the hand of the reticle transportation device 10 will be described with reference to FIG. 4.

At the top of the clean stocker 2, a clean gas supply unit 16 is provided. For example, a clean gas such as a clean air or nitrogen is supplied as a down flow. For example, the clean gas supply unit 16 includes means for producing the clean gas, a fan filter unit, or a mechanism for taking the down flow of the clean air from the ceiling of the clean room into the stocker 2. Reference numerals 18, 19 denote load ports for overhead traveling vehicles, provided at high positions in the clean stocker 2. Overhead traveling vehicles (not shown) store pods 26, e.g., shown in FIG. 3 in, and retrieves the pods 26 from the load ports 18, 19. Reference numerals 20, 21 denote load ports on the ground. For example, the load ports 20, 21 are used when the pods 26 are manually stored, and retrieved. A reference numeral 22 is a terminal used for manually operating the clean stocker 2, inputting and outputting data, or reading IDs of the pods. A reference numeral 24 denotes a casing of the clean stocker 2.

Figure 2:
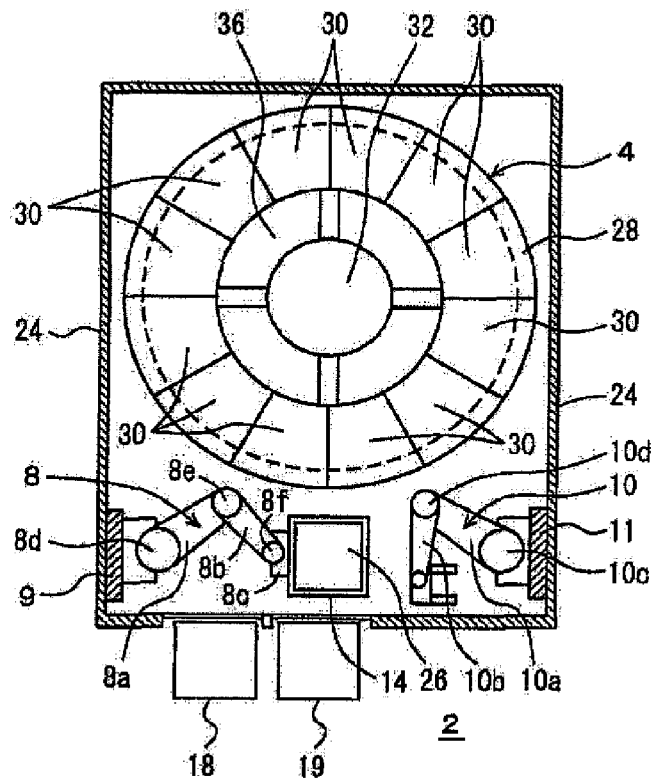
FIG. 2 is a horizontal cross sectional view taken along a line II-II in FIG. 1.
Figure 3:
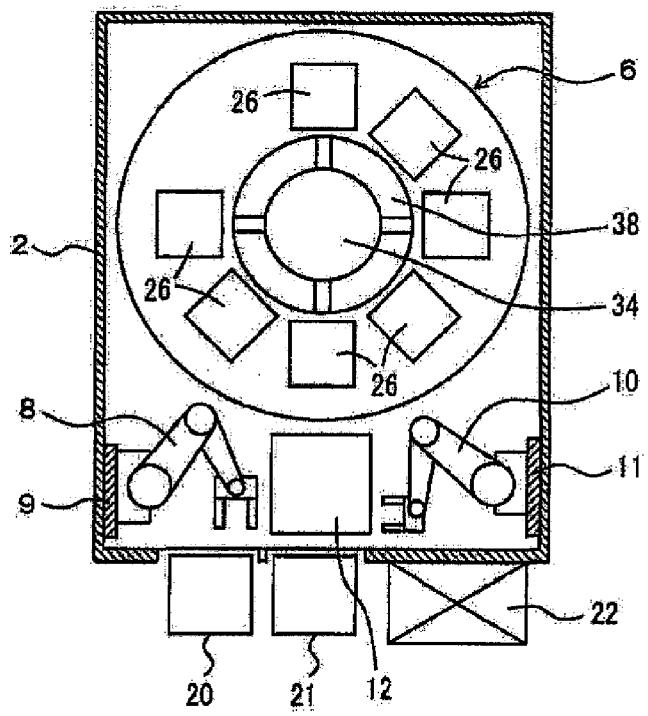
FIG. 3 is a horizontal cross sectional view taken along a line III-III in FIG. 1.
Figure 4:
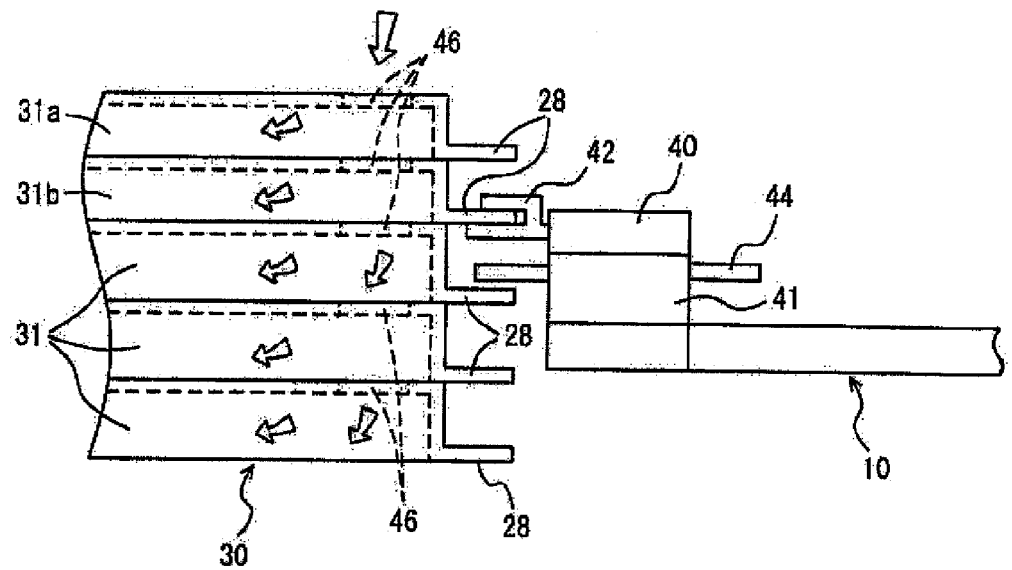
FIG. 4 is a view schematically showing reticle hands according to an embodiment.
Figure 5:
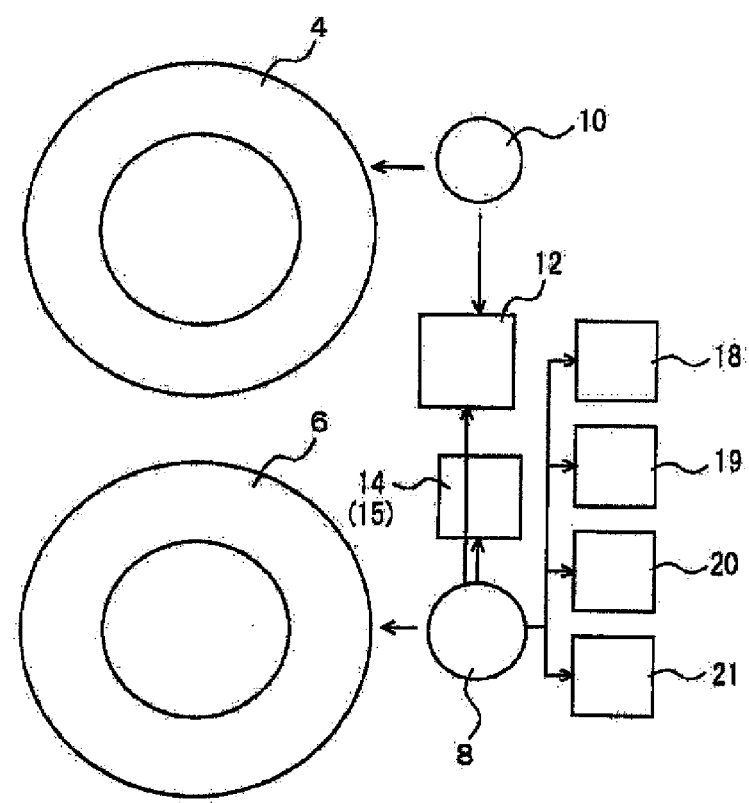
FIG. 5 is a view showing operating ranges of transportation devices relative to two rotation racks, a pod opener, fixing racks, and load ports.
2: clean stocker
4: reticle rotatable rack
6: pod rotatable rack
8: pod transportation device
10: reticle transportation device
9, 11: elevation guide
12: pod opener
14, 15: pod fixed rack
16: clean gas supply unit
18, 19: load port for overhead traveling vehicle
20, 21: ground side load port
22: terminal
24: casing
26: pod
28: flange
30: block
31: stage
32, 34: drive unit
36, 38: gas flow path
40, 41: joint
42, 44: hand
46: clean gas supply path

The reticle rotatable rack 4 is divided into a plurality of blocks 30 (FIG. 2), and a flange 28 is provided in the outer region of the reticle rotatable rack 4. The flange 28 is used for lifting vertically overlapped stages 31 of the blocks 30, respectively (FIG. 4). A drive unit 32 rotates the reticle rotatable rack 4, and an open space inside the rotatable rack 4 is used as a gas flow path 36. The clean gas supplied from the clean gas supply unit 16 to the reticle rotatable rack 4 is discharged downwardly through the gas flow path 36 (FIG. 2). The pod rotatable rack 6 has a drive unit 34 at its center. The drive unit 34 rotates the rack 6, and discharges the clean gas of the gas flow path 38 around the drive unit 34. The clean gas in the rack 6 is discharged downwardly (FIG. 3).

FIG. 4 shows the block 30 of the reticle rotatable rack and hands 42, 44 at the front end of the reticle transportation device 10. The hand 42 chucks the flange 28, and lifts the flange 28 upwardly for allowing a reticle (not shown) to move into or move out of the reticle rotatable rack. The hand 44 for the reticle is provided, e.g., below the hand 42. The hands 42, 44 are rotated independently from each other in a horizontal plane. After chucking the flange 28 using the hand 42 to lift the stages 31a, 31b upwardly, the hand 44 is rotated at the joint 41 to move the reticle below the stage 31b into or out of the reticle rotatable rack 4. A reference numeral 46 denotes clean gas supply paths each made up of an opening or a filter provided in each stage 31. The clean gas is supplied through the clean gas supply path toward the reticle.

Operation of the embodiment will be described. After the pods 26 are transported by the overhead traveling vehicle or manually to the load ports 18 to 21, the pods 26 are transported by the pod transportation device 8 to the pod opener 12 and the pod fixed racks 14, 15. Since the load ports 18, 19, the load ports 20, 21, the pod opener 12, and the fixed racks 14, 15 are provided at different height positions, the pod transportation device 8 is elevated or lowered along the elevation guide 9. At this time, in the case of storing a large number of pods successively, the pod fixed racks 14, 15 are used as buffers for compensating the slow operation in the pod opener 12. Further, for the reticle which is likely to be used frequently in a light exposure apparatus, and expected to be retrieved soon after its storage, without separating the reticle from the pod 26 using the pod opener 12, the reticle is kept in the pod 26, and stored in the pod fixed rack 14, or 15 until it is retrieved. When the reticle is taken out by the pod opener 12, the reticle is stored in the reticle rotatable rack 4 by the reticle transportation device 10. The reticle rotatable rack 4 is rotated, and the reticle transportation device 10 is elevated or lowered at the same time, and a desired stage of the reticle rotatable rack 4 is lifted in a manner as shown in FIG. 4 to move the reticle into or out of the reticle rotatable rack 4. Further, the empty pod left in the pod opener 12 is stored in the pod rotatable rack 6 by the pod transportation device 8.

At the time of storing a pod, the empty pod is taken out from the pod rotatable rack 6 using the pod transportation device 8, and the pod is set to the pod opener 12. Likewise, a desired reticle is taken out from the reticle rotatable rack 4 using the reticle transportation device 10, and the reticle is set in the pod using the pod opener 12. After the reticle is set in the pod, the pod may be transported immediately to any of the load ports 18 to 21 by the pod transportation device 8. If the load ports 18 to 21 are occupied, the pod is temporarily stored in the pod fixed rack 14, 15 to wait until any of the load ports 18 to 21 becomes empty.

In the clean stocker 2, the clean gas from the clean gas supply unit 16 is initially supplied to the reticle rotatable rack 4, and then, the clean gas is supplied to the pod rotatable rack 6. Therefore, the atmosphere around the reticle rotatable rack 4 storing the reticles which are not placed in the pods is kept clean, and it is possible to prevent contamination of the reticles.

The invention claimed is:

1. A clean stocker for storing and retrieving an article placed in a container from a storage and retrieval port, the clean stocker comprising:
a container opening and closing device for placing the article into, and taking the article out of the container;
an article storage rack, said article storage rack being disposed on an upper side of said container opening and closing device, said article storage rack being circular and having a center in top plan view;
a container storage rack, said container storage rack being disposed on a lower side of said container opening and closing device;
a container transportation device for transporting the container among said container opening and closing device, said storage and retrieval port, and said container storage rack; and
an article transportation device for transporting the article between said container opening and closing device and said article storage rack,
wherein said article storage rack and said container storage rack vertically overlap each other in plan view,
wherein a down flow of a clean gas is provided in the clean stocker,
wherein said container opening and closing device is located in the vicinity of a periphery of said article storage rack,
wherein said article transportation device and said container transportation device are located along a perpendicular line substantially perpendicular to a radial line connecting the center of said article storage rack and said container opening and closing device, and
wherein said article transportation device and said container transportation device are located on opposite sides of said container opening and closing device along the perpendicular line such that said article transportation device and said container transportation device face each other in top plan view.

2. The clean stocker according to claim 1, wherein said article storage rack and said container storage rack are horizontally rotatable independently from each other.

3. The clean stocker according to claim 2, further comprising a fixed rack for storing the container, separate from said container storage rack, said fixed rack being disposed at a position to which said container transportation device may transport the container.

4. A method of retrieving and storing an article placed in a container from a retrieval and storage port, the method comprising:
placing the article into, and taking the article out of the container retrieved and stored through said retrieval and storage port, using a container opening and closing device;
storing the article on an article storage rack disposed on an upper side of said container opening and closing device, said article storage rack being circular and having a center in top plan view;
storing the container on a container storage rack disposed on a lower side of said container opening and closing device;
supplying clean gas to said article storage rack, and thereafter, to said container storage rack;
transporting the container among said container opening and closing device, said retrieval and storage port, and said container storage rack using a container transportation device; and
transporting the article between said article storage rack and said container opening and closing device using an article transportation device,
wherein said article storage rack and said container storage rack vertically overlap each other in plan view,
wherein the article is stored cleanly by providing a down flow of the clean gas,
wherein said container opening and closing device is located in the vicinity of a periphery of said article storage rack,
wherein said article transportation device and said container transportation device are located along a perpendicular line substantially perpendicular to a radial line connecting the center of said article storage rack and said container opening and closing device, and
wherein said article transportation device and said container transportation device are located on opposite sides of said container opening and closing device along the perpendicular line such that said article transportation device and said container transportation device face each other in top plan view.

5. The method according to claim 4, wherein said article storage rack and said container storage rack are horizontally rotatable independently from each other.

6. The method according to claim 5, further comprising:
storing the container on a fixed rack separate from said container storage rack,
wherein said fixed rack is disposed at a position to which said container transportation device may transport the container.

* * * * *